(12) United States Patent
Nickel

(10) Patent No.: US 8,976,569 B2
(45) Date of Patent: Mar. 10, 2015

(54) MITIGATION OF INOPERABLE LOW RESISTANCE ELEMENTS IN PROGRAMABLE CROSSBAR ARRAYS

(71) Applicant: Hewlett-Packard Development Company, L.P., Houston, TX (US)

(72) Inventor: Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 142 days.

(21) Appl. No.: 13/754,431

(22) Filed: Jan. 30, 2013

(65) Prior Publication Data

US 2014/0211535 A1    Jul. 31, 2014

(51) Int. Cl.
*G11C 11/00* (2006.01)
*G11C 13/00* (2006.01)

(52) U.S. Cl.
CPC .................................. *G11C 13/0069* (2013.01)
USPC ........................................................ 365/148

(58) Field of Classification Search
USPC ........................................................ 365/148
See application file for complete search history.

(56) References Cited

U.S. PATENT DOCUMENTS

| | | | |
|---|---|---|---|
| 7,855,085 B2 | 12/2010 | Drewes et al. | |
| 7,986,575 B2 | 7/2011 | Inaba | |
| 8,089,120 B2 | 1/2012 | Tanaka et al. | |
| 2006/0028247 A1* | 2/2006 | Hara et al. | 326/104 |
| 2008/0170432 A1* | 7/2008 | Asao | 365/171 |
| 2012/0112167 A1 | 5/2012 | Ribeiro et al. | |
| 2012/0170353 A1 | 7/2012 | Iijima et al. | |
| 2013/0051134 A1* | 2/2013 | Kawahara et al. | 365/158 |

OTHER PUBLICATIONS

Kvatinsky, S. et al., Memristor-based Imply Logic Design Procedure, IEEE 29th International Conference on Computer Design (ICCD), Oct. 9-12, 2011, pp. 142-147.

* cited by examiner

*Primary Examiner* — Hoai V Ho
(74) *Attorney, Agent, or Firm* — Van Cott, Bagley, Cornwall & McCarthy

(57) ABSTRACT

A programmable crossbar array includes a layer of row conductors and a layer of column conductors with the row conductors crossing over the column conductors to form junctions. Programmable crosspoint devices are sandwiched between a row conductor and a column conductor at a junction. Each programmable crosspoint device includes a data element with a first programming threshold and a control element with a second programming threshold, in which the second programming threshold is greater than the first programming threshold. A method for mitigating shorts in a programmable crossbar array is also provided.

20 Claims, 5 Drawing Sheets

MITIGATION OF INOPERABLE LOW RESISTANCE ELEMENTS IN PROGRAMABLE CROSSBAR ARRAYS

BACKGROUND

Resistive memory elements are devices that can be programmed to different resistive states by applying programming energy. After programming, the state of the resistive memory elements can be read and remains stable over a specified time period. Large crossbar arrays of resistive memory elements can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Crossbar arrays of resistive memory elements can be used in a variety of applications, including non-volatile solid state memory, programmable logic, signal processing, control systems, pattern recognition, and other applications. However, failures of the memory elements can negatively impact the capacity and performance of the crossbar array. For example, if a memory element shorts, the memory elements in the same row and column as the shorted element may be unusable. A variety of other failure mechanisms can also occur due to manufacturing or degradation over time. For example, a device may no longer switch from ON to OFF states. These shorted and permanently ON elements are collectively called "inoperable low resistance elements."

Additionally, some crossbar architectures use silicon based components for switching of the memory elements. However, silicon based architectures are not compatible with many materials and structures. For example, it can be difficult to make multilayer memories using silicon based architectures because silicon transistors require high purity single crystalline silicon that is difficult to grow over the underlying layers. The principles described below provide for fault tolerant crossbar arrays that are not dependent on silicon functionality.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1A:
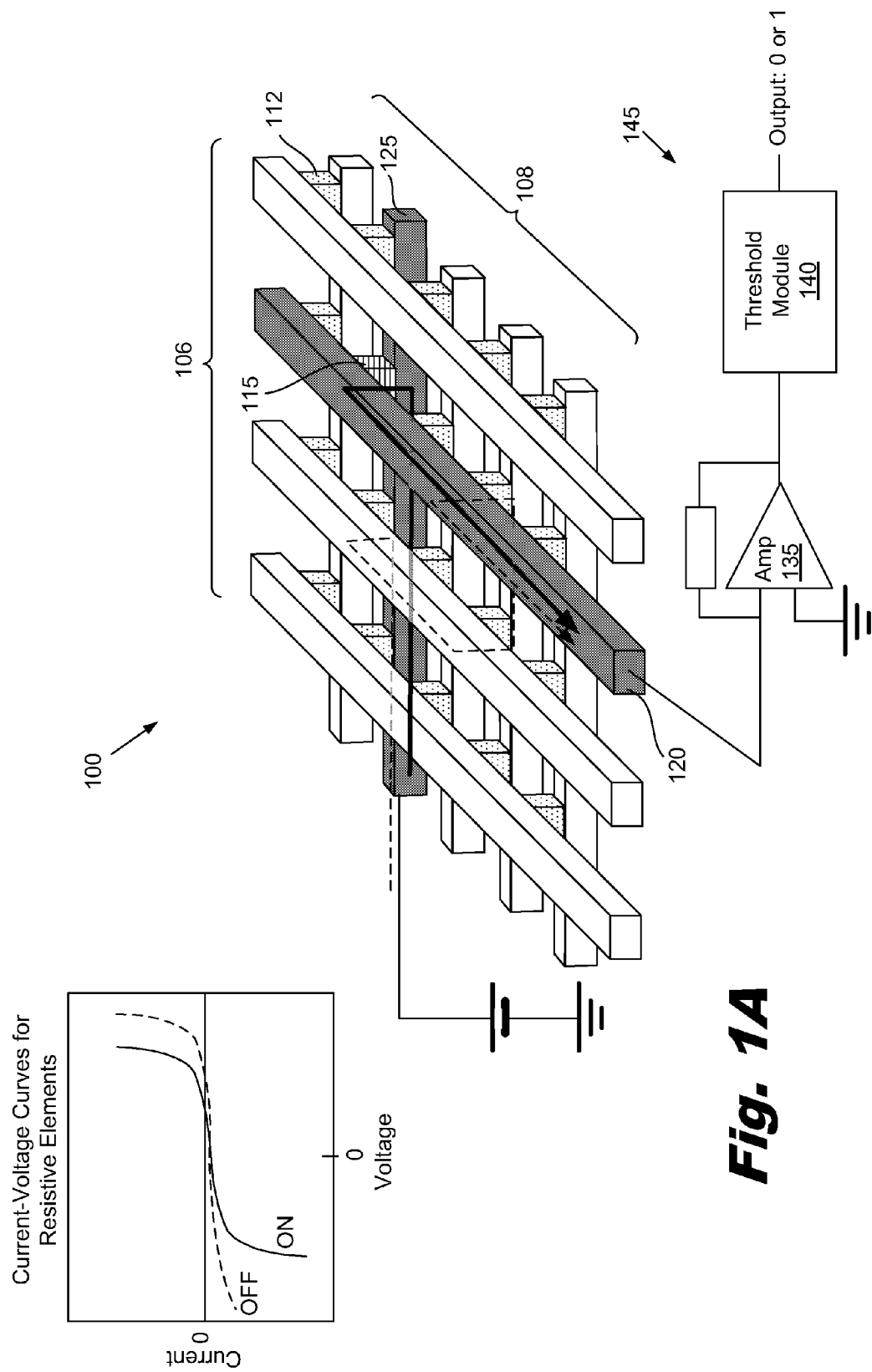
FIG. 1A is a schematic diagram of a programmable crossbar array that is populated with two-element resistive devices at each crossbar junction, according to one example of principles described herein.

FIG. 1A is a perspective view of a programmable crossbar array (100) that is populated with two element resistive devices (112) at each crossbar junction. The crossbar array (100) includes a first group of conductive lines (106) called "column conductors" and a second group of conductive lines (108) called "row conductors." The column conductors (106) cross the row conductors (108) to form crossbar junctions. At the crossbar junctions, two-element resistive devices (112, 115) are formed between conductors in the first group and conductors in the second group. For example, a two-element resistive device (115) has been formed between a selected column conductor (120) in the first group of lines and a selected row conductor (125) in the second group of lines. For purposes of description, only a small portion of the crossbar array (100) has been illustrated. The crossbar array may include many more conductors, crossbar junctions, and memory devices. In this example, the crossbar is shown as a parallel and perpendicular grid. However, the crossbar array may have a variety of other configurations.

In one implementation, the voltage/current curves of the resistive elements that make up the devices are nonlinear. This is shown in the graph on the upper left hand corner of FIG. 1A. The horizontal axis of the graph shows various voltages applied across a resistive element, with the center of the axis being zero volts with increasing positive voltages to the left and negative voltages to the right. The vertical axis shows current flowing through the devices, with zero current at the mid point of the graph. This allows for a memory elements that do not require a diode or silicon based transistor.

As shown in the graph, the behavior of the resistive elements is highly nonlinear, with minimal current flowing through the device for small positive and negative voltages. This is shown by the flat regions of the graph centered around zero volts. However, for larger positive or negative voltages, the current flowing though the device increases. When an element is in its "ON" configuration, the current increases rapidly for larger voltages as shown by the steeply curved ends of the solid line. When an element is in its "OFF" configuration, the current through the device increases more slowly for larger voltages. The OFF curve is a dashed line with flatter curves indicating that less current flows through an OFF device than an ON device for a given voltage. The difference between the current flowing though the OFF device and an ON device allows the resistance state of the element to be determined. In some examples, the resistive elements can be used to store data, with the ON or low resistance state representing a digital 1 and an OFF or high resistance state representing a digital 0. In other implementations, the memory elements may be multilevel cells that have more than two readable states.

To address a given resistive device (115), the row and column conductors (120, 125) connected to the resistive device are selected. A read voltage $V_r$ is applied along the row and/or column conductors (120, 125) to read the state of the resistive device or a write voltage $V_w$ is applied to change the state of the resistive device. For example, a voltage of $V_w/2$ could be applied to the selected row conductor (125) and a voltage of $-V_w/2$ could be applied to the selected column conductor (120) to provide enough voltage to switch the device from the OFF state to the ON state or vice-versa depending on the interface of the switching. Alternatively, $V_w$ can be applied to the row conductor, and ground to the column conductor with the other row and column conductors floating, to also switch the device. The stack at the intersection between the selected row and column conductors is the selected resistive device (115), while other resistive devices that are connected to only one of the selected row (125) or column (120) crossbars are called "half-selected" devices. The selected device (115) experiences the sum of the two voltages (V). Any combination that leads to a $V_w$ voltage drop across the selected resistive device may be used to switch the selected resistive device.

Similarly for reading, a total voltage $V_r$ is applied to the selected resistive, so that there is a significant difference in the current between an ON and OFF state of the device, or equivalently the resistance between the ON and OFF state.

For either reading or writing the selected device, ideally, all of the current applied to the selected row/column conductor (120, 125) would pass through the selected device (115). The half selected devices experience a much lower voltage ($V_r/2$ or $-V_r/2$). At these lower voltages, the resistance of the half-selected devices is much higher and substantially lower current flows through them. However, the half-selected devices can create "sneak paths" through which current can flow from the selected row conductor (125) to the selected column conductor (120) without passing through the selected device. These sneak currents are not desirable and act as noise that obscures the measurement of the state of the selected device (115). For writing, the sneak paths mean much more current needs to be applied to the system, requiring larger transistors to handle the current and larger drivers to provide the current. These larger driving circuits increase the size of the total memory array and architecture, increasing the cost per bit.

The graph in the left corner of FIG. 1A shows the measurement current as a solid line that passes along the selected row conductor (125), through the selected device (115) and down the selected conductor (120) to the sense circuit (145). The sneak current, shown as dashed line, passes through a half selected device connected to the selected row (125), down an unselected column, through an unselected device, across an unselected row, and through a half selected device connected to the selected column (120). There are a large number of sneak paths through various half-selected and unselected devices. As discussed above, this sneak current represents undesirable noise in the measurement. However, the nonlinearity of the devices minimizes these currents.

The combination of all the currents is received by a sense amplifier (135). The output of the sense amplifier is received by a threshold module (140) that makes a determination if the selected device (115) is in an ON or OFF state and outputs a corresponding digital 1 or 0.

Figure 1B:
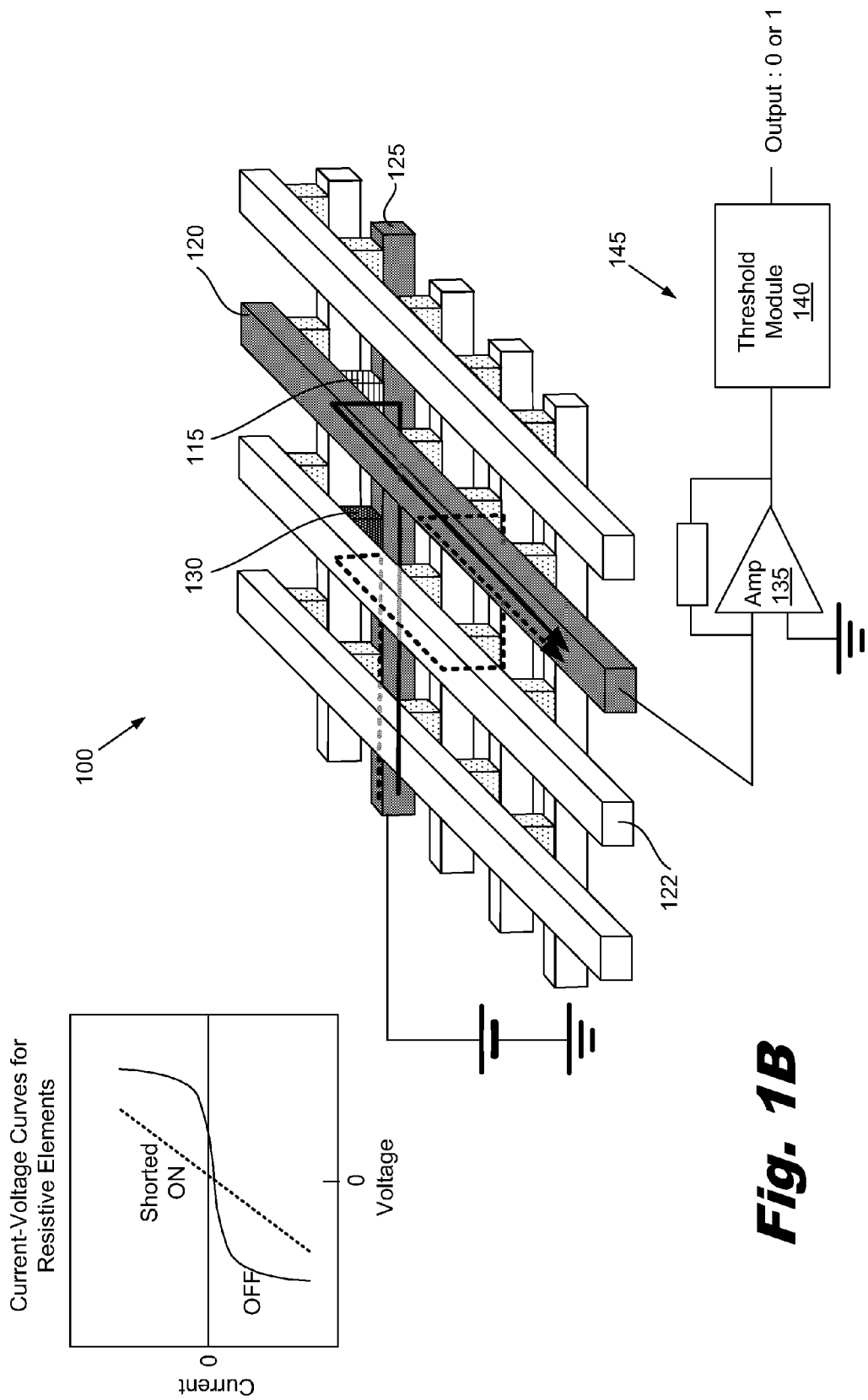
FIG. 1B is a schematic diagram of a crossbar array populated with two-element resistive devices at each crossbar junction where one resistive element has inoperable low resistance state, according to one example of principles described herein.

FIG. 1B shows the effect of an inoperative low resistance element (130). The inoperative low resistance element may be either shorted or stuck in an ON state. A shorted element has an electrical resistance that is substantially lower than any operating resistance of the device. As discussed below, physical characteristics of a shorted element have typically been permanently changed so that there is an electrical connection made across the element.

A stuck ON element has a higher resistance than a shorted element but maintains its nonlinear characteristics. The stuck ON element is no longer useful as a memory device and allows the sneak currents to pass through it. The array would function better if the stuck ON element could be turned OFF (adjusted to a high resistance state). Because the stuck ON element no longer switches states, the change in the resistance can be accomplished using a separate component. The stuck ON element does not directly influence the operation of surrounding devices, but removing it from the circuit will improve the performance of the array overall.

In the example of FIG. 1B, the inoperative low resistance element is a shorted element. As shown in the current-voltage graph in the upper left of the figure, the shorted element (130) has lost its nonlinear characteristics and has a very low resistance. This is shown by the linear dashed line labeled "Shorted ON" The shorting can occur for a variety of reasons, including any event or series of events that results in permanent physical change in the characteristics of the resistive element. For example, an excessively high electrical current may have passed through the device and resulted in Coulomb heating that melted/fused the layers that make up the resistive element. The shorted element (130) is no longer useful in storing data.

The shorted element may also render all other devices connected to the same row and column conductors unusable because their states cannot be determined. When an element is shorted the sneak currents dramatically increase. In the example shown in FIG. 1B, the device (130) just to the left of the selected device (115) has shorted. The electrical resistance of the shorted device (130) may be lower than the electrical resistance of all other devices connected to the selected row (125). Consequently, a significant amount of sneak current passes through the shorted device (130). As discussed above, the sneak current obscures the desired measurement of the selected device's (115) state.

The graph in the left corner of FIG. 1B shows this increase in the amount of selected current as a dashed line passing through the shorted device (130). When the sense amplifier (135) receives the current from the selected column (120), a significant portion of the current is sneak current. The sense current that passes through the selected device (115) is shown as a solid line. The sense amp (135) and threshold module (140) in the sense circuitry (145) may not be able to determine the state of the selected device (115) because of the increased noise in the measurement. For a resistive array that has only one resistive element at each junction there is no way to recover from the shorting of the element and the memory capacity of the devices connected to the row (125) and column (122) of the shorted element (130) and it may be unusable. For example, if the crossbar array (100) includes 1000 row conductors and 1000 column conductors intersecting the row conductors, then the 2000 devices may be rendered unusable by a single shorted element. This represents a significant reduction in the capacity of the crossbar array (100). However, for a resistive array that includes two element resistive devices, the short can be mitigated and corrected as described below.

If the inoperative low resistance element was only stuck ON rather than shorted, it would have a higher electrical resistance and nonlinear characteristics but would still contribute to sneak paths. While the stuck ON element does not interfere with reading or switching other devices, removing the stuck ON element from the circuit would increase the circuit performance.

Figure 2:
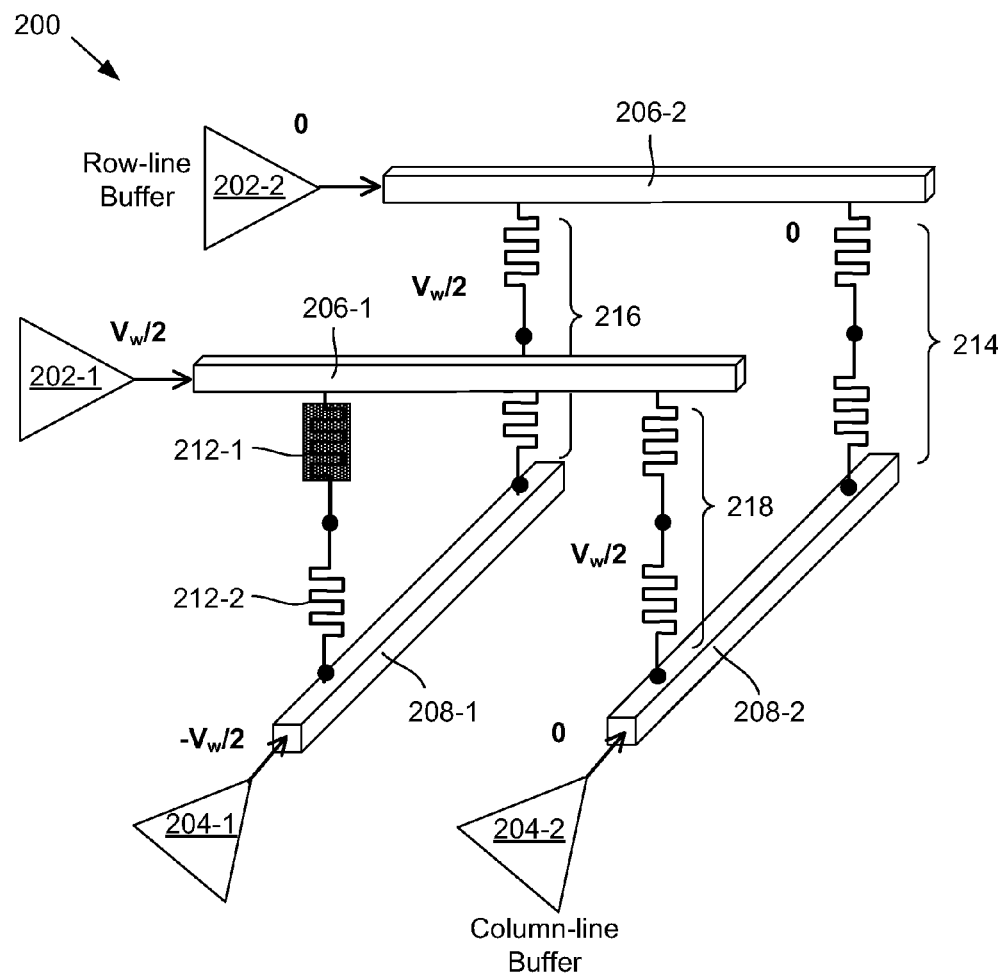
FIG. 2 is a schematic diagram of a portion of a crossbar array showing the two-element resistive devices at each crossbar junction, according to one example of principles described herein.

FIG. 2 shows a schematic diagram of a crossbar array (200) with four crosspoint devices (212, 214, 216, 218) that include two resistive elements. Of course the crossbar array (200) may include many more crosspoint devices, but for purposes of description only four are shown. In this illustration, the row lines (206) are connected to the row-line buffers (202) and the column lines (208) are connected to the column line buffers (204). The various row and column lines (206, 208) may also be connected to various sense or support circuitry.

The data elements (e.g. 212-1) and control elements (e.g. 212-2) are in series within the crosspoint devices (212, 214, 216, 218). Any current passing through the crosspoint devices necessarily passes through both the data element and the control element. The overall resistance of the crosspoint device is determined by the sum of the resistances of the data element and control element. In some examples, the switching characteristics and resistances of the data element and control element may be significantly different. For example, the low resistance ON state of the control element may be significantly lower than the low resistance ON state of the data element. This may provide a number of advantages. For example, both the data element and the control element may be in their low resistance ON configuration. To switch the data element from an "ON" state to an "OFF" state a programming voltage is applied. The programming voltage is divided across the data element and the control element proportional to their respective resistances. Because the resistance of the control element is lower than the resistance of the data element, there is more voltage drop across the data element. This allows the data element to switch with a lower applied programming voltage and the switching operation consumes lower amounts of power.

In other implementations, the "ON" resistance of the control element may be at an intermediate level that is the same or greater than the ON resistance of the data element. This may provide advantages such as minimizing leakage currents in the array and minimizing current spikes that occur during switching the data element from a high resistance state to a low resistance state (OFF to ON).

As shown in FIG. 2, a resistive data element (212-1) in the programmable crosspoint device (212) is in an inoperative low resistance state as indicated by the shaded box. If the data element (212-1) is shorted, this could significantly reduce the capacity of the crossbar array (200) by making all devices connected to the column line (208-1) and the row line (206-1) unreadable. Further, the short could cause the buffers (202-1, 204-1) to fail. However, the control element (212-2) could be used to compensate for the shorting of its companion element by switching from the low resistance state to a high resistance state when it is determined that the data element has shorted.

In this example, the roles and characteristics are different for the two elements (212-1, 212-2) that make up the crosspoint devices (212) in the crossbar array (200). The data element (212-1) is used to store data by changing its state. The second element is used as a control element (212-2) that compensates for shorting failures of the first element. The data element is configured to be responsive to a programming voltage $V_w$. The application of the programming voltage to the data element causes the state of the data element to change. The state of the data element can then be read by applying a reading voltage as discussed above. The data element may be configured for fast state transitions and for a long lifetime.

The control element (212-2) may have the same characteristics as the data element (212-1) or may be substantially different. In implementations where the control element is only meant to mitigate shorting of the data element, the control element may be significantly different than the data element. For example, the control element may have a substantially higher switching voltage than the data element. Ordinarily, the control element would be in a low resistance ON state. Because of its higher switching voltage, the state of the control element (212-2) would remain unchanged during normal read/write operations performed on the data element (212-1). However, when shorting of the data element is sensed, state of the control element can be changed from a low resistance state to a high resistance state by applying a higher switching voltage. The resistance state of the crosspoint device (212) then substantially increases such that it is no longer a significant sneak path. For example, during normal operation, the ON state of the crosspoint device may have a resistance in the 1 kohm to 10 Mohm range and the OFF state is substantially higher in resistance, in the range of at least 3 times the ON resistance to orders of magnitude higher than the ON resistance. When the data element shorts and can no longer be switched OFF, the control element may be switched to the OFF state and increase the overall resistance of the crosspoint device to that similar or greater than the OFF state of the data element. This prevents the data stored in all other devices that are connected to the row and column from being lost and allows these devices to continue being used. In other examples, switching of the control element to an OFF state may result in the crosspoint device having a resistance that is comparable or lower than the OFF state of the data element.

Alternatively, the control element (212-2) may have a much longer switching time than the data element (212-1). For example, the data element may have a switching time on the order of nanoseconds, while the control element may have a switching time that is on the order of microseconds or longer. Programming voltages that are applied to the data element would not have sufficient duration to change the state of the control element. In some implementations, the polarity of the cumulative programming voltages applied to the data element could be balanced over the long term so that the state of the control element does not change due to repeated programming pulses having the same polarity.

In some examples, the control element (212-2) may have the same switching endurance as the data element (212-1). For example, both the control element and the data element may be able to switch states thousands of times before significant degradation. In this configuration, the combination of the data element and control element may produce a crosspoint device (212) with more than two states. This may produce a crossbar memory array with a significantly greater capacity while mitigating failure of the data element. In other examples, the control element may step into the place of the data element when the data element shorts. Using the control element as a backup for the data element may significantly increase in the read/write endurance of the crossbar memory array.

However, because the role of the control element in most configurations is to remain in a low resistance ON state during normal operations and then switch to a high resistance OFF state when the data element shorts or is stuck in an ON state, the control element may be designed to have a much more limited switching endurance. In some examples, the control element may only be able to switch once: from ON to OFF.

In some implementations, the control element may have the same composition as the data element but may have a significantly different geometry. For example, where crosspoint devices use mobile dopants in a matrix as the switching mechanism, the control element may have a significantly thicker matrix than the data element. This can result in both a higher switching voltage and longer switching time for the control element. The mobile dopants in the control element need to move farther to alter the conductance of the control element, thus resulting in a longer switching time. The thicker matrix may also result in a lower voltage gradient across the matrix for a given voltage. Many dopant/matrix combinations require a minimum voltage gradient to induce motion of the mobile dopants within the matrix. Consequently, when the control element matrix is significantly thicker than the data element matrix, the switching voltage for the control element may be higher than the switching voltage for the data element.

In other implementations, the control element may have a different dopant/matrix combination than the data element. For example, the control element may use the same matrix but use a dopant that is less mobile within the matrix than the dopant used by the data element. Alternatively, the control element may use a different matrix and the same dopant or a different matrix and a different dopant.

The data and control elements that make up each of the programmable crosspoint devices may have a variety of configurations. In some examples the data and control elements may be memristors, resistive random access memory (ReRAM), conductive-bridging random access memory (CBRAM), phase change memory (PRAM, PCRAM), and other types of memory. For example, the crosspoint devices could be resistive memory based on perovskites (such as Sr(Zr)TiO$_3$ or PCMO), transition metal oxides (such as Ta$_2$O$_5$, NiO or TiO$_2$,), chalcogenides (such as Ge$_2$Sb$_2$Te$_5$ or AgInSbTe), solid-state electrolyte materials (such as GeS, GeSe, or Cu$_2$S), organic charge transfer complexes (such as CuTCNQ), organic donor-acceptor systems (such as Al AlDCN), and various other material and molecular systems. In some examples, the data element and control element may be memristors. As discussed above, the data element and control element may have different switching and resistance characteristics that are a result of the matrix, dopant, and geometric selections. For example, the control element may use a dopant with a lower mobility than the dopant used in the data element.

Figure 3:
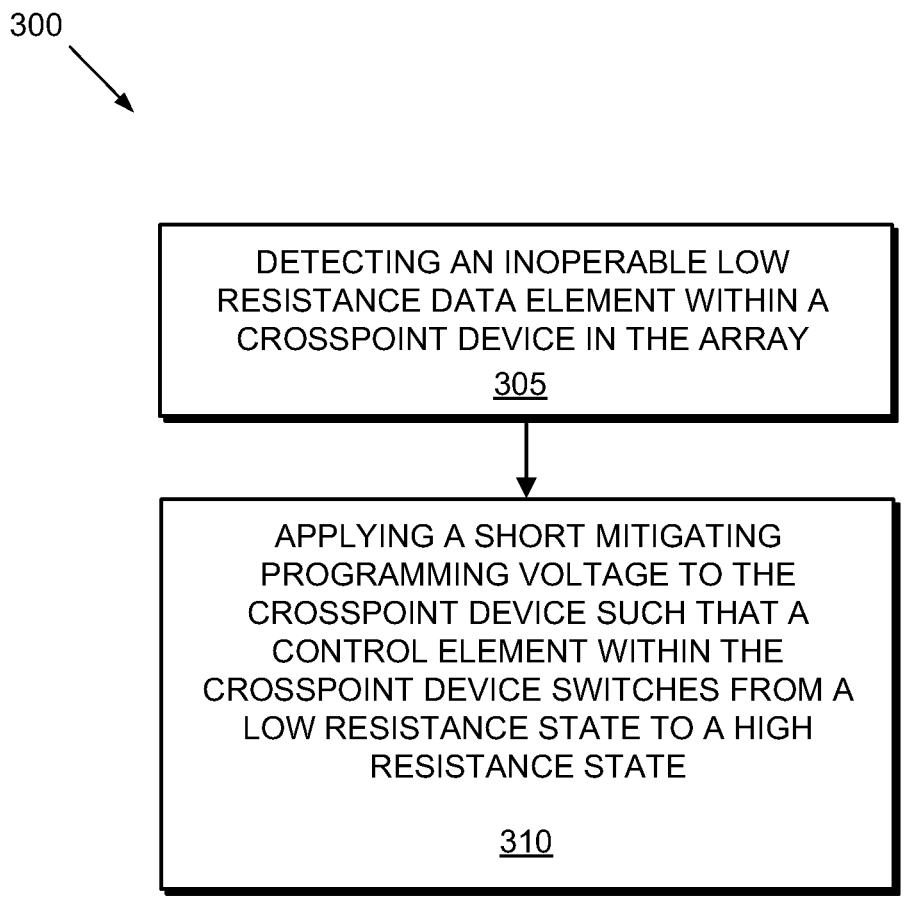
FIG. 3 is a flowchart of an illustrative method for mitigating inoperable low resistance elements in a programmable crossbar array, according to one example of principles described herein.

FIG. 3 is a flowchart (300) which describes a method for mitigating inoperable low resistance data elements in a programmable crossbar array. As discussed above, the inoperable low resistance data elements may have a resistance that is significantly less than the lowest operating resistance ("shorted elements") or may exhibit a low operating resistance that cannot be switched to an OFF state using the normal programming voltages ("stuck ON" elements). For multilevel cells, a shorted element has a lower resistance than the lowest designed resistance of the multilevel cell or a higher current than the maximum expected current.

The method includes detecting an inoperable low resistance data element within a crosspoint device in the array (305). The inoperable low resistance data element may be detected in a number of ways. If the inoperable low resistance data element exhibits an electrical resistance that is lower than the standard "ON" resistance of the data element, the shorting of the data element can be detected by measuring the abnormally low electrical resistance. For example, when applying a reading voltage to the shorted element, an abnormally high current may flow through the shorted element. By way of illustration, a low resistance ON state of a data element may be in the 10 kohms to 10 Mohms range while a high resistance OFF state of a data element may be three orders of magnitude higher. In general, the OFF state can have any resistance that is discernible from the ON state. When the data element shorts, its electrical resistance may be significantly lower than the ON state. For example, the shorted data element may have an electrical resistance that at least an order of magnitude lower than the ON state of the data element. For a given voltage, significantly more current would flow through a shorted data element than a data element that was in the normal ON configuration. A stuck ON data element may exhibit an electrical resistance that is similar to other ON data elements and consequently may be difficult to identify using resistance and/or current measurements.

A variety of other methods may be used to identify an inoperable low resistance data element. For example, a first programming voltage could be applied to switch the data element from a low resistance ON state to a high resistance OFF state. However, because the data element shorted or "stuck ON", it will not respond to this or any other programming voltage. After applying the first programming voltage, it can be determined that the data element did not switch to the high resistance OFF state, thus indicating that the data element may be shorted or "stuck ON". This can be double checked by applying a second programming voltage to switch the data element from the low resistance ON state to the high resistance OFF state. The second programming voltage may have a longer duration, greater number of voltage pulses, and/or a voltage level that is greater than the first programming voltage. Alternatively, the second programming voltage may be the same as the first programming voltage. After application of the second or subsequent programming voltage, it can be determined that even if the data element is not necessarily shorted, it is unusable because it does not switch. The overall usability of the array will be increased by setting the crosspoint device containing the shorted data element to a high resistance state. This will reduce leakage currents and reduce the amount of power consumed by the array.

Once it is determined that the data element has been shorted or is "stuck ON" or is otherwise inoperable, a short mitigating programming voltage may be applied to the crosspoint device such that a control element within the crosspoint device switches from a low resistance state to a high resistance state (310). The short mitigating programming voltage may have a longer duration, greater number of voltage pulses, and/or a voltage level that is greater than any applied programming voltage to switch the data element. In one example, the data element and control element may have the same switch polarity. Where the data element and control element have the same switching polarity, the short mitigating programming voltage will switch the control element to its high resistance OFF state and will also tend to switch, if possible, the data element from its low resistance state to its high resistance state.

The data that was stored, or was intended to be stored, on the shorted data element can be recovered in a variety of ways. For example, if it is desirable for the data written on the data element to be recovered, error correction code can be used. Error correction code is derived from a block of data and is designed to allow a limited number of errors to be corrected. Error correction code can compensate for errors caused by write issues, noise, storage faults, failure of data elements, and other types of errors.

In other situations, the data to be written to the crossbar array may be most important. This data can be preserved by maintaining the data in a separate memory until it is confirmed that the write to the crossbar array is successful and complete. When failure occurs, the data can simply be rewritten to a different location in the crossbar array.

In some situations, the data elements may disproportionately fail during a write operation because the write operation uses higher voltages than a read operation. Further, the data elements may disproportionately fail during write operations that transition from a high resistance state to a low resistance state. This may occur for a variety of reasons, including the generation of a current spike that occurs as the data element's electrical resistance rapidly drops during the switching process. Because the typical failure characteristics of the data elements can be characterized in advance, the data bit that was intended to be stored on the shorted data element can be assumed. For example, if the data elements tend to fail during a write operation from a high resistance OFF state to a low resistance ON state, it can be assumed with a predetermined level of confidence that the shorted data element should be read as being in the ON state or a digital 1.

The crosspoint device containing the shorted data element can then be marked as unusable. This can done in a variety of ways, including the generation of a bad bit table that tracks the known bad bits within the crossbar memory array.

Figure 4:
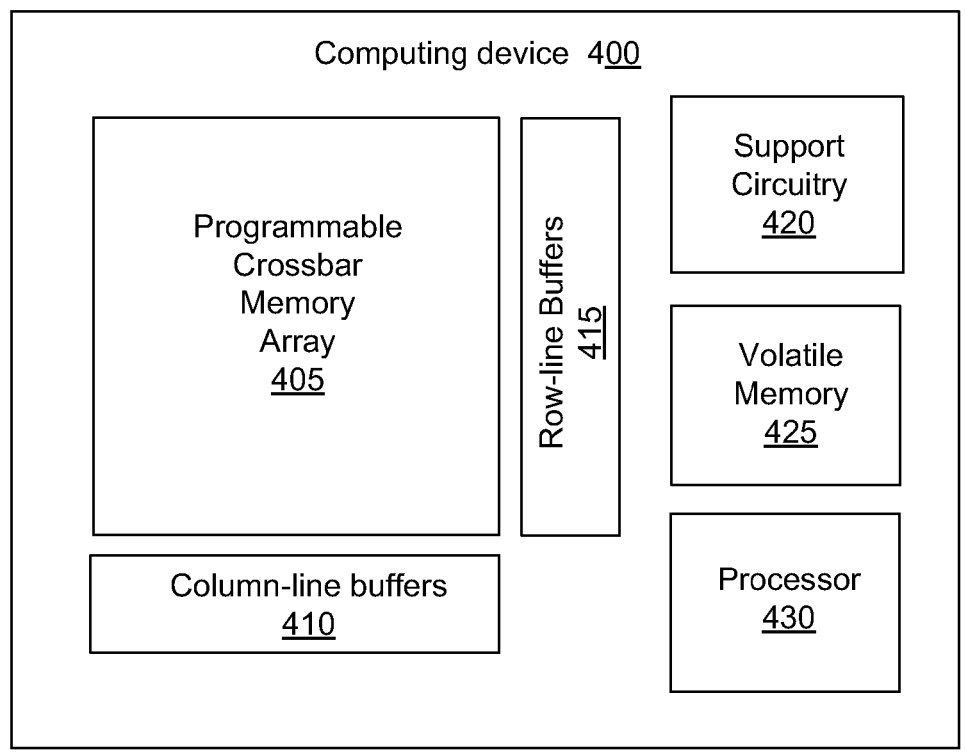
FIG. 4 is a system diagram of computing device that includes a programmable crossbar array, according to one example of principles described herein.

FIG. 4 is a diagram of a computing device (400) that includes a programmable crossbar array (405) with short mitigation. Crosspoint devices that include a data element and a control element are interposed between intersecting crossbars in the crossbar array (405). The crossbars in the crossbar array (405) are connected to column line buffers (410) and row line buffers (415). The column line buffers (410) and row line buffers (415) are selectively activated to apply voltages to column conductors and row conductors. This addresses memory devices in the crossbar array (405). The support circuitry (420) may include a variety of circuits including sense circuitry, threshold modules, sample and hold circuits and other circuits that support the function of the crossbar array (405).

The processor (430) and volatile memory (425) work cooperatively to detect a potentially shorted data element within the crossbar array (405) and direct a corrective programming voltage to be applied to the potentially shorted data element. If the corrective programming voltage fails to rectify the short, a short mitigating programming voltage may be applied to the crosspoint device such that a control element within the crosspoint device switches from a low resistance state to a high resistance state. The processor and volatile memory may also be programmed to recover data that was stored or intended to be stored on the shorted data element.

The principles described above provide for programmable crosspoint devices that include a data element with a first programming threshold and a control element with a second programming threshold, with the second programming threshold being greater than the first programming threshold. The programming threshold may be voltage magnitude, duration of applied voltage, number of voltage pulses, or other parameter. The difference in the programming voltage thresholds allows the control element to maintain a constant state during the use of the data element. When the data element shorts, the control element may be programmed according to the second programming threshold to mitigate the effects of the shorted data element.

The principles described above provide for graceful degradation of the programmable crossbar array. By mitigating the shorting of a data element, the capacity and lifetime of the programmable crossbar array is not significantly altered. Further, the mitigation of shorting failures using a control element in the programmable crosspoint device eliminates the need for transistors or diodes to be located in the crossbar array. This can remove the need for silicon to be used in the crossbar array, improve the density of the crossbar array, allow multiple crossbar arrays to be stacked on top of each other, reduce power consumption, and provide other benefits.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A programmable crossbar array with short mitigation comprising:
   a layer of row conductors;
   a layer of column conductors, the row conductors crossing over the column conductors to form junctions; and
   programmable crosspoint devices sandwiched between a row conductor and a column conductor at a junction, each programmable crosspoint device comprising:
   a data element with a first programming threshold;
   a control element with a second programming threshold, in which the second programming threshold is greater than the first programming threshold;
   in which both the control element and data element each comprise mobile dopants in a matrix.

2. The array of claim 1, in which the first programming threshold is a first programming voltage sufficient to change the state of the data element and the second programming threshold is a second programming voltage that is greater than the first programming voltage, such that application of the first programming voltage across the programmable crosspoint device alters the state of the data element but not the control element.

3. The array of claim 1, in which the first programming threshold comprises a duration of a programming voltage, the second programming threshold comprising a longer duration than the first programming threshold.

4. The array of claim 1, in which the data element and control element have different switching characteristics.

5. The array of claim 1, in which the data element has more than two programmed states and operates as a multilevel cell.

6. A programmable crossbar array with short mitigation comprising:
   a layer of row conductors;
   a layer of column conductors, the row conductors crossing over the column conductors to form junctions; and
   programmable crosspoint devices sandwiched between a row conductor and a column conductor at a junction, each programmable crosspoint device comprising:
   a data element with a first programming threshold;
   a control element with a second programming threshold, in which the second programming threshold is greater than the first programming threshold;
   in which the control element has a low resistance ON state maintained when the data element is functional and a high resistance OFF state maintained when the data element is in an inoperable low resistance state.

7. The array of claim 1, in which the data element and the control element are series memristors.

8. A programmable crossbar array with short mitigation comprising:
   a layer of row conductors;
   a layer of column conductors, the row conductors crossing over the column conductors to form junctions; and
   programmable crosspoint devices sandwiched between a row conductor and a column conductor at a junction, each programmable crosspoint device comprising:
   a data memristor element with a first programming threshold;
   a control memristor element with a second programming threshold, the control element comprising a low resistance ON state maintained when the data element is functional and a high resistance OFF state maintained when the data element is in an inoperable low resistance state; in which:
   the second programming threshold is greater than the first programming threshold;

the first programming threshold is a first programming voltage sufficient to change the state of the data element and the second programming threshold is a second programming voltage that is greater than the first programming voltage, such that application of the first programming voltage across the programmable crosspoint device alters the state of the data element but not the control element.

9. A method for mitigating shorts in a programmable crossbar array comprising:
   detecting an inoperable low resistance data element within a crosspoint device in the array; and
   applying a short mitigating programming voltage to the crosspoint device such that a control element within the crosspoint device switches from a low resistance state to a high resistance state.

10. The method of claim 9, in which detecting the inoperable low resistance data element within a crosspoint device comprises:
   applying a first programming voltage to switch a target data element from a low resistance ON state to a high resistance OFF state; and
   after applying the first programming voltage, determining that the target data element did not switch to the high resistance OFF state and identifying the target data element as the inoperable low resistance data element.

11. The method of claim 10, further comprising:
   applying a second programming voltage to switch the inoperable low resistance data element from the low resistance ON state to the high resistance OFF state, in which the second programming voltage has at least one of a duration, pulse number, or voltage level that is greater than the first programming voltage;
   after applying the second programming voltage, determining that the data element did not switch to the high resistance OFF state.

12. The method of claim 11, in which a switching polarity of the data element and the control element are the same.

13. The method of claim 9, in which detecting the inoperable low resistance data element within the crosspoint device comprises determining that the crosspoint device exhibits an abnormally low electrical resistance.

14. The method of claim 9, in which detecting the inoperable low resistance data element within the crosspoint device comprises detecting an abnormally large current passing through the crosspoint device.

15. The method of claim 9, further comprising:
   recovering data stored in the inoperable low resistance data element; and
   marking the crosspoint device containing the inoperable low resistance data element as unusable.

16. The array of claim 1, in which a resistance state of the data element represents stored data while a resistance state of the control element does not represent stored data.

17. The array of claim 1, in which the control element has a different geometry than the data element, with the control element being thicker than the data element.

18. The array of claim 1, in which the control element comprises a less mobile dopant than the dopant of the data element.

19. The array of claim 1, in which the control element comprises a different matrix than the data element.

20. The array of claim 1, in which the control element take a longer time to switch between resistance states than the data element.

* * * * *